(12) United States Patent
Kim et al.

(10) Patent No.: US 10,713,137 B2
(45) Date of Patent: Jul. 14, 2020

(54) MEMORY MODULE

(71) Applicant: SK hynix Inc., Gyeonggi-do (KR)

(72) Inventors: Hyun-Seok Kim, Gyeonggi-do (KR); Jae-Won Han, Seoul (KR); Chang-Soo Ha, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 107 days.

(21) Appl. No.: 15/980,275

(22) Filed: May 15, 2018

(65) Prior Publication Data

US 2019/0087292 A1 Mar. 21, 2019

(30) Foreign Application Priority Data

Sep. 20, 2017 (KR) .......................... 10-2017-0121049

(51) Int. Cl.
| | |
|---|---|
| *G06F 11/00* | (2006.01) |
| *G06F 11/20* | (2006.01) |
| *G11C 29/52* | (2006.01) |
| *G06F 11/10* | (2006.01) |
| *G11C 29/44* | (2006.01) |
| *G11C 29/00* | (2006.01) |
| *G11C 8/12* | (2006.01) |

(52) U.S. Cl.
CPC ...... *G06F 11/2094* (2013.01); *G06F 11/1048* (2013.01); *G06F 11/1068* (2013.01); *G11C 29/4401* (2013.01); *G11C 29/52* (2013.01); *G11C 29/765* (2013.01); *G11C 29/883* (2013.01); *G06F 2201/82* (2013.01); *G11C 8/12* (2013.01); *G11C 2029/4402* (2013.01)

(58) Field of Classification Search
CPC ............. G11B 20/1883; G06F 11/1068; G06F 11/1666; G06F 11/1072; G06F 11/0727; G06F 11/073; G06F 11/1008; G06F 11/2053
USPC ........................................................ 714/6.13
See application file for complete search history.

(56) References Cited

U.S. PATENT DOCUMENTS

| | | | | |
|---|---|---|---|---|
| 9,424,173 | B2* | 8/2016 | Dinkjian | ................. G06F 12/02 |
| 2014/0101382 | A1* | 4/2014 | Kaviani | ............. G06F 12/0246 |
| | | | | 711/105 |
| 2015/0363287 | A1* | 12/2015 | Dell | ...................... G06F 3/0619 |
| | | | | 714/6.3 |
| 2016/0147623 | A1* | 5/2016 | Ping | ................... G06F 12/1009 |
| | | | | 714/6.13 |
| 2016/0202914 | A1* | 7/2016 | Hsu | .......................... G06F 3/061 |
| | | | | 714/49 |
| 2017/0125119 | A1* | 5/2017 | Loh | ........................ G11C 17/16 |

FOREIGN PATENT DOCUMENTS

| | | |
|---|---|---|
| KR | 1020130012299 | 2/2013 |
| KR | 1020160060549 | 5/2016 |

* cited by examiner

*Primary Examiner* — Sarai E Butler
(74) *Attorney, Agent, or Firm* — IP & T Group LLP

(57) ABSTRACT

A memory module includes: a plurality of first memory ranks that belong to a first group; a plurality of second memory ranks that belong to a second group; and a rank mapping circuit suitable for mapping a defective first memory rank among the first memory ranks to a defect-free second memory rank among the second memory ranks.

10 Claims, 6 Drawing Sheets

FIG. 3B

| A | | | | B | | | |
|---|---|---|---|---|---|---|---|
| CS | CID | | | CS | CID | | |
| 0 | 0 | 0 | 0 | 1 | 0 | 0 | 0 |
| 0 | 0 | 0 | 1 | 0 | 0 | 0 | 1 |
| 0 | 0 | 1 | 0 | 0 | 0 | 1 | 0 |
| 0 | 0 | 1 | 1 | 1 | 1 | 0 | 0 |
| 0 | 1 | 0 | 0 | 0 | 1 | 0 | 0 |
| 0 | 1 | 0 | 1 | 0 | 1 | 0 | 1 |
| 0 | 1 | 1 | 0 | 0 | 1 | 1 | 0 |
| 0 | 1 | 1 | 1 | 0 | 1 | 1 | 1 |

FIG. 4B

| A | | | | B | | | |
|---|---|---|---|---|---|---|---|
| CS | CID | | | CS | CID | | |
| 0 | 0 | 0 | 0 | 1 | 1 | 1 | 1 |
| 0 | 0 | 0 | 1 | 0 | 0 | 0 | 1 |
| 0 | 0 | 1 | 0 | 0 | 0 | 1 | 0 |
| 0 | 0 | 1 | 1 | 1 | 1 | 1 | 0 |
| 0 | 1 | 0 | 0 | 0 | 1 | 0 | 0 |
| 0 | 1 | 0 | 1 | 0 | 1 | 0 | 1 |
| 0 | 1 | 1 | 0 | 0 | 1 | 1 | 0 |
| 0 | 1 | 1 | 1 | 0 | 1 | 1 | 1 |
| 1 | 0 | 0 | 0 | 1 | 0 | 0 | 0 |
| 1 | 0 | 0 | 1 | 1 | 1 | 0 | 1 |
| 1 | 0 | 1 | 0 | 1 | 0 | 1 | 0 |
| 1 | 0 | 1 | 1 | 1 | 1 | 0 | 0 |
| 1 | 1 | 0 | 0 | X | X | X | X |
| 1 | 1 | 0 | 1 | X | X | X | X |
| 1 | 1 | 1 | 0 | X | X | X | X |
| 1 | 1 | 1 | 1 | X | X | X | X |

MEMORY MODULE

CROSS-REFERENCE TO RELATED APPLICATIONS

The present application claims priority of Korean Patent Application No. 10-2017-0121049, filed on Sep. 20, 2017, which is incorporated herein by reference in its entirety.

BACKGROUND

1. Field

Exemplary embodiments of the present invention relate to a memory module.

2. Description of the Related Art

As mobile communication terminals, such as smart phones and tablet PC (Personal Computer), come into wide use recently and the use of the Social Network Services (SNS) and Machine-to-Machine (M2M) networks, and sensor networks increase, the amount of data, the generation rate that the data are generated, and the diversity of the data are increasing geometrically. To process big data, not only high data rate of a memory but also large data storage capacity of a memory device and a memory module including the memory device are required.

When a memory module of a DIMM (Dual In-Line Memory Module) type, which is used as a current system memory, is fabricated to have a large capacity, the number of memory devices that are included in the memory module may be increased, which may cause more defects. Therefore, a technology for coping with the increased number of defects will be highly desirable.

SUMMARY

Embodiments of the present invention are directed to a memory module capable of operating even when a defect occurs.

In accordance with an embodiment of the present invention, a memory module may include: a plurality of first memory ranks that belong to a first group; a plurality of second memory ranks that belong to a second group; and a rank mapping circuit suitable for mapping a defective first memory rank among the first memory ranks to a defect-free second memory rank among the second memory ranks.

A supply of a clock toward the defective first memory rank among the first memory ranks is blocked off, and the supply of the clock toward a defective second memory rank among the second memory ranks may be blocked off.

A supply of the clock toward a defective second memory rank and second memory ranks that are not used for the mapping among the second memory ranks may be blocked off.

The memory module may further include: a plurality of clock gating circuits suitable for controlling the supply of the clock toward the first memory ranks and the second memory ranks.

The memory module may further include: a Serial Presence Detect (SPD) suitable for providing a memory controller with information representing that a total capacity of the memory module is equal to a total capacity of the first group.

The rank mapping circuit may be included in a module controller, and the module controller may include: an error correction code (ECC) generation circuit suitable for generating an error correction code which is to be stored together with a write data which is to be programmed in the first group and the second group based on the write data which is to be programmed in the first group and the second group; and an error correction circuit suitable for correcting an error of a read data which is read from the first group and the second group based on the error correction code which is read from the first group and the second group.

The module controller may further include: a command buffer circuit suitable for buffering a command which is to be transferred to the first group and the second group; and an address buffer circuit suitable for buffering an address which is to be transferred to the first group and the second group.

The memory module may further include: a plurality of data buffers suitable for receiving a write data transferred from a memory controller and transferring the received write data to the module controller, and receiving a read data transferred from the module controller and transferring the received read data to the memory controller.

Each of the first memory ranks and the second memory ranks may include a plurality of memory devices.

Each of the memory devices may be a Dynamic Random Access Memory (DRAM), and the memory module may be of a Dual In-Line Memory Module (DIMM).

In accordance with another embodiment of the present invention, a memory module may include: a plurality of memory ranks; and a mapping circuit suitable for mapping the memory ranks based on rank defect information, wherein a supply of a clock toward defective memory ranks among the memory ranks is blocked off.

The mapping circuit may operate to map memory ranks of lower numbers among one or more defective memory ranks to memory ranks of higher numbers among one or more defect-free memory ranks.

The memory module may further include: a plurality of clock gating circuits suitable for controlling the supply of the clock toward the memory ranks.

The memory module may further include: a Serial Presence Detect (SPD) suitable for providing a memory controller with information representing that a total capacity of the memory module is a capacity obtained by subtracting a capacity of the defective memory ranks from a total capacity of the memory ranks.

The rank mapping circuit may be included in a module controller, and the module controller may include: an error correction code generation circuit suitable for generating an error correction code which is to be stored together with a write data which is to be programmed in the memory ranks based on the write data which is to be programmed in the memory ranks; and an error correction circuit suitable for correcting an error of a read data which is read from the memory ranks based on the error correction code which is read from the memory ranks.

The module controller may further include: a command buffer circuit suitable for buffering a command which is to be transferred to the memory ranks; and an address buffer circuit suitable for buffering an address which is to be transferred to the memory ranks.

Each of the memory ranks may include a plurality of memory devices.

Each of the memory devices may be a Dynamic Random-Access Memory (DRAM), and the memory module may be of a Dual In-Line Memory Module (DIMM).

The memory ranks may be divided into a plurality of first memory ranks that belong to a first group and a plurality of second memory ranks that belong to a second group, and the mapping circuit may map a defective first memory rank among the first memory ranks to a defect-free second memory rank among the second memory ranks.

The supply of the clock toward second memory ranks that are not used for the mapping among the second memory ranks may be blocked off.

In accordance with another embodiment of the present invention, a method of operating a memory module may include: dividing a plurality of memory ranks into a plurality of first memory ranks and a plurality of second memory ranks; and mapping a defective first memory rank among the first memory ranks to a defect-free second memory rank among the second memory ranks.

The method may further include: blocking off a supply of a clock toward the defective first memory rank among the first memory ranks and blocking off a supply of the clock toward a defective second memory rank among the second memory ranks.

The method may further include: blocking off a supply of the clock toward a defective second memory rank and second memory ranks that are not used for the mapping among the second memory ranks.

The memory module may comprises a memory controller, and wherein the method may further comprise: providing the memory controller with information representing that a total capacity of the memory module is equal to a total capacity of the first memory ranks.

The method may further include: generating an error correction code which is to be stored together with a write data which is to be programmed in the first memory ranks and the second memory ranks based on write data which is to be programmed in the first group and the second group; and correcting an error of a read data which is read from the first memory ranks and the second memory ranks based on the error correction code which is read from the first memory ranks and the second memory ranks.

The method may further include: buffering a command which is to be transferred to the first and second memory ranks; and buffering an address which is to be transferred to the first and the second memory ranks.

The memory module may comprise: a memory controller; a plurality of clock gating circuits suitable for controlling the supply of the clock toward the first memory and second memory ranks; and a plurality of data buffers suitable for receiving a write data transferred from a memory controller and transferring the received write data to the module controller, and receiving a read data transferred from the module controller and transferring the received read data to the memory controller.

Each of the first memory ranks and the second memory ranks may include a plurality of memory devices.

Each of the memory devices may be a DRAM, and the memory module may be a DIMM.

These and other features and advantages of the present invention will become apparent to those with ordinary skill in the art to which the present invention belongs from the following description in conjunction with the accompanying drawings.

BRIEF DESCRIPTION OF THE DRAWINGS

FIG. 3B illustrates a mapping table of the rank mapping circuit shown in FIG. 2.

FIG. 4B illustrates a mapping table of the rank mapping circuit shown in FIG. 2.

DETAILED DESCRIPTION

Figure 1:
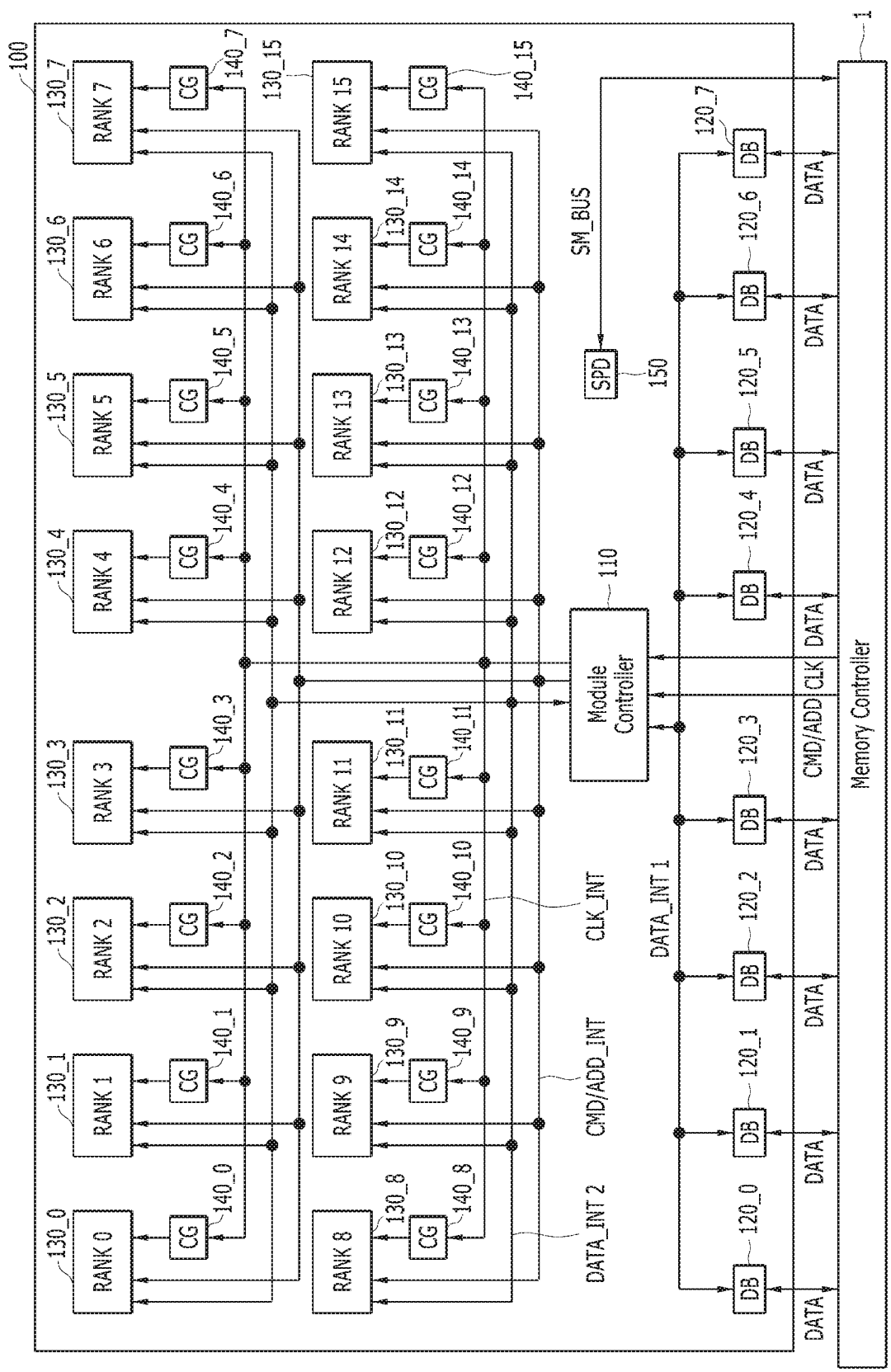
FIG. 1 is a block diagram illustrating a memory module 100 in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

The terminology used herein is for the purpose of describing particular embodiments only and is not intended to be limiting of the present invention. As used herein, singular forms are intended to is include the plural forms as well, unless the context clearly indicates otherwise.

It will be further understood that the terms "comprises", "comprising", "includes", and "including" when used in this specification, specify the presence of the stated elements and do not preclude the presence or addition of one or more other elements. As used herein, the term "and/or" includes any and all combinations of one or more of the associated listed items.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a memory module 100, in accordance with an embodiment of the present invention. For the sake of convenience in description, a memory controller 1 of a host for controlling the memory module 100 is illustrated together in FIG. 1.

Referring to FIG. 1, the memory module 100 may include the module controller 110, data buffers 120_0 to 120_7, memory ranks 130_0 to 130_15, clock gating circuits 140_0 and 140_15, and a Serial Presence Detect (SPD) 150. The memory module 100 may be of a DIMM type.

Each of the memory ranks 130_0 to 130_15 may include a plurality of memory devices (chips). For example, each of the memory ranks 130_0 to 130_15 may include nine memory devices. In this case, the memory module 100 may include a total of 144 memory devices (144=16*9). In the memory module 100, a read operation and a write operation may be performed on the basis of a memory rank. For example, in a write operation, a memory rank may be selected among the memory ranks 130_0 to 130_15 and the write operation may be performed simultaneously in the nine memory devices of the selected memory rank. Likewise, in a read operation, a memory rank may be selected among the memory ranks 130_0 to 130_15 and the read operation may be performed simultaneously in the nine memory devices of the selected memory rank. Each of the memory devices included in each of the memory ranks 130_0 to 130_15 may be one of a Dynamic Random Access Memory (DRAM), a Resistive Random Access Memory (RRAM), a Phase-Change Random Access Memory (PRAM), a Ferroelectric Random Access Memory (FRAM), a Magnetic Random Access Memory (MRAM) and the like.

During a write operation, the data buffers 120_0 to 120_7 may receive data DATA from the memory controller 1 and transfer the received data DATA to the module controller 110. During a read operation, the data buffers 120_0 to 120_7 may receive data from the module controller 110 and transfer the received data to the memory controller 1. In FIG. 1, 'DATA_INT1' may represent an internal data bus for transferring/receiving data between the data buffers 120_0 to 120_7 and the module controller 110 in the inside of the memory module 100.

The module controller 110 may buffer a command CMD, an address ADD, and a clock CLK transferred from the memory controller 1 and transfer them to at least one of the memory ranks 130_0 to 130_15. Also, the module controller 110 may transfer data between the data buffers 120_0 to 120_7 and the memory ranks 130_0 to 130_15. The module controller 110 may generate an error correction code (ECC) based on a write data which is transferred from the data buffers 120_0 to 120_7 during a write operation. Also, the module controller 110 may transfer the write data and the error correction code to at least one of the memory ranks 130_0 to 130_15 so that the write data and the error correction code are programmed in the at least one of the memory ranks 130_0 to 130_15. Also, during a read operation, the module controller 110 may correct an error of a read data which is read from at least one of the memory ranks 130_0 to 130_15 based on the error correction code, which is read from the at least one of the memory ranks 130_0 to 130_15, and transfer the error-corrected read data to at least one of the data buffers 120_0 to 120_7. Therefore, data may be transferred through the internal data bus DATA_INT1 between the at least one of the data buffers 120_0 to 120_7 and the module controller 110. The data and the error correction code may be transferred through an internal data bus DATA_INT2 between the module controller 110 and the at least one of the memory ranks 130_0 to 130_15. Through an error correction code generation operation and the error correction code operation in the module controller 110, the problem of the increase in the number of errors caused by the increase in the capacity and number of memory devices that are included in the memory ranks 130_0 to 130_15 may be at least partly solved.

The module controller 110 may map a memory rank including a defect among the memory ranks 130_0 to 130_15 to another memory rank among the memory ranks 130_0 to 130_15. When there is a memory rank including a defect among the memory ranks 130_0 to 130_15, the entire part of the memory module 100 may not be used. However, even though there is a memory rank including a defect among the memory ranks 130_0 to 130_15, the memory module 100 may be still used by performing a memory rank mapping operation of the module controller 110. The module controller 110 may apply mapping information of the memory ranks 130_0 to 130_15 to the SPD 150 so that the SPD 150 is updated with information on the capacity which is available in the memory module 100 based on the mapping information. The module controller 110 may control the clock gating circuits 140_0 and 140_15 for preventing the supply of the clock CLK to a memory rank which is decided not to be used based on mapping among the memory ranks 130_0 to 130_15.

The clock gating circuits 140_0 and 140_15 may control the supply of the clock CLK to the memory ranks 130_0 to 130_15. The clock gating circuits 140_0 and 140_15 may control the supply of the clock CLK to the memory ranks 130_0 to 130_15 under the control of the module controller 110. For example, supposing that only the memory ranks 130_0 to 130_7 and 130_10 to 130_15 are used and the memory ranks 130_8 and 130_9 are not used in the memory module 100, the clock gating circuits 140_0 and 140_7 and 140_10 and 140_15 may supply the clock CLK to the memory ranks 130_0 to 130_7 and 130_10 to 130_15 and may prevent to supply the clock CLK to the memory ranks 130_8 and 130_9. When clock CLK supply to the memory ranks 130_8 and 130_9 is prevented, current consumption in the memory ranks 130_8 and 130_9 may be reduced remarkably. FIG. 1 illustrates that the clock gating circuits 140_0 and 140_15 exist separately from the memory ranks 130_0 to 130_15, however, it is noted that in a variation of the described embodiment, the clock gating circuits 140_0 and 140_15 may be provided inside respective memory ranks 130_0 to 130_15. For example, there may be clock gating circuits 140_0 and 140_15 inside each of the memory ranks 130_0 to 130_15.

The SPD 150 may store information on the memory module 100. The SPD 150 may also store the number of ranks included in the memory module 100, information on the capacity of the memory module 100, and information on diverse parameters of the memory module 100. The information stored in the SPD 150 may be applied to the memory controller 1 through a system management bus SM_BUS. The number of ranks included in the memory module 100 and the information on the total capacity of the memory module 100 stored in the SPD 150 may be updated based on a mapping result of the memory ranks 130_0 to 130_15 of the module controller 110.

In FIG. 1, an internal command/address bus CMD/ADD_INT may transfer the command CMD and the address ADD inside the memory module 100. Also, an internal clock bus CLK_INT may transfer the clock CLK inside the memory module 100.

Figure 2:
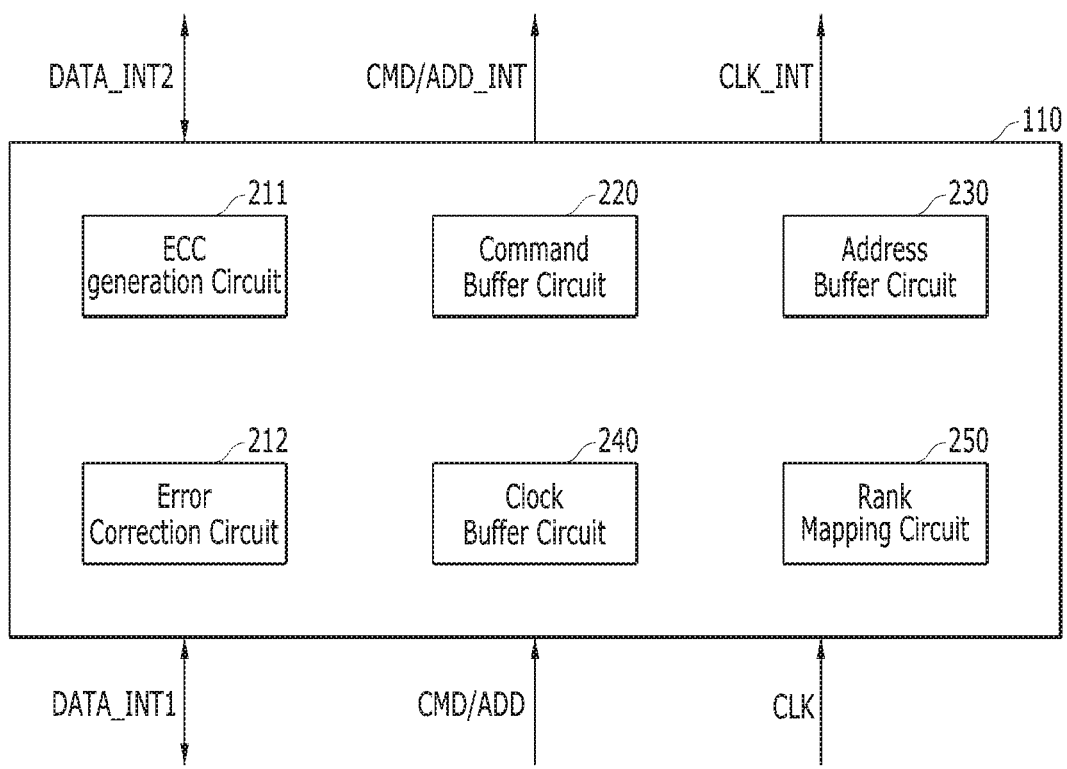
FIG. 2 is a block diagram illustrating a module controller shown in FIG. 1.

FIG. 2 is a block diagram illustrating an exemplary configuration of the module controller 110 shown in FIG. 1.

Referring to FIG. 2, the module controller 110 may include an error correction code generation circuit 211, an error correction circuit 212, a command buffer circuit 220, an address buffer circuit 230, a clock buffer circuit 240, and a rank mapping circuit 250.

The error correction code generation circuit 211 may operate during a write operation. The error correction code generation circuit 211 may generate an error correction code using data transferred from at least one of the data buffers 120_0 to 120_7, and transfer data and the error correction code to at least one of the memory ranks 130_0 to 130_15. Data may be transferred through the internal data bus DATA_INT1, and data and the error correction code may be transferred through the internal data bus DATA_INT2.

The error correction circuit 212 may operate during a read operation. The error correction circuit 212 may correct an error of a data based on the error correction code which is read from at least one of the memory ranks 130_0 to 130_15, and transfer the error-corrected data to at least one of the data buffers 120_0 to 120_7.

The command buffer circuit 220 may buffer the command CMD transferred from the memory controller 1, and the command buffer circuit 220 may buffer the address ADD transferred from the memory controller 1 to the internal command/address bus CMD/ADD_INT. Also, the clock buffer circuit 240 may buffer the clock CLK transferred from the memory controller 1 to the internal clock bus CLK_INT. The ranks are mapped by the rank mapping circuit 250, hence a portion for selecting a rank in the address ADD and a portion for selecting a rank in the address ADD_INT can be different.

The rank mapping circuit 250 may map a defective memory rank among the memory ranks 130_0 to 130_15 to a defect-free memory rank. Herein, the defective memory rank may be a memory rank that includes a number of defective memory cells that is above a threshold correctable number of defects. Thus, the defective memory rank includes defects that are no longer repairable even by the error correction circuit 212. The mapping scheme of the rank mapping circuit 250 may, for example, include a half capacity scheme or a linear scheme. The mapping scheme of the rank mapping circuit 250 may be described in detail with reference to FIGS. 3A and 3B, and FIGS. 4A and 4B, respectively.

Figure 3A:
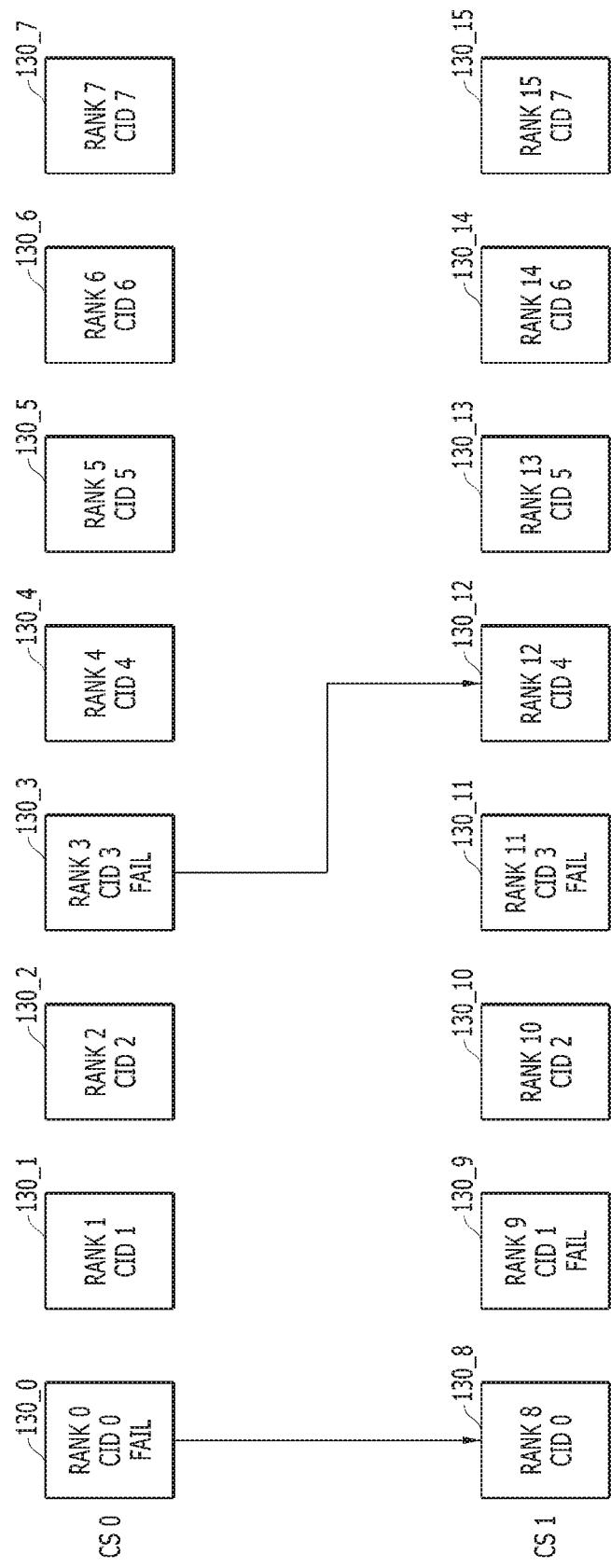
FIG. 3A illustrates (1) a half capacity scheme, which is a mapping scheme of a rank mapping circuit shown in FIG. 2.

FIG. 3A illustrates (1) a half capacity scheme of the rank mapping circuit 250.

Referring to FIG. 3A, the memory ranks 130_0 to 130_15 may include first memory ranks 130_0 to 130_7 of a first group corresponding to a $0^{th}$ chip selection signal CS0, and second memory ranks 130_8 to 130_15 of a second group corresponding to a first chip selection signal CS1.

The first memory ranks 130_0 to 130_7 may be selected based on a chip identification CID when the $0^{th}$ chip selection signal CS0 is enabled. For example, when the $0^{th}$ chip selection signal CS0 is enabled and a third chip identification CID3 is selected, a first memory rank 130_3 may be selected, and when a fifth chip identification CID5 is selected, a first memory rank 130_5 may be selected. The chip selection signals CS0 and CS1 may be command signals used to select a rank among command signals. The chip identification CID may be a portion of an address used to select a rank among addresses.

When the first chip selection signal CS1 is enabled, the second memory ranks 130_8 to 130_15 belonging to the second group may be selected based on a chip identification CID. For example, when the first chip selection signal CS1 is enabled and a first chip identification is selected, a second memory rank may be selected, and when a third chip identification is selected, a second memory rank may be selected.

According to the half capacity scheme, half of the memory ranks 130_0 to 130_15 may be used. In other words, according to the half capacity scheme, only the first memory ranks 130_0 to 130_7 may be used and the second memory ranks 130_8 to 130_15 may not be used. The rank mapping circuit 250 may map defective first memory ranks 130_0 and 130_3 among the first memory ranks 130_0 to 130_7 to second memory ranks 130_8 and 130_12. The first memory rank 130_0 may be mapped to the second memory rank 130_8 having the same chip identification. In case of the first memory rank 130_3, since the second memory ranks 130_11 having same chip identification also has a defect, the first memory rank 130_3 may be mapped to a defect-free second memory rank 130_12.

The rank mapping circuit 250 may control the clock gating circuits 140_0 and 140_15 to supply the clock to the memory ranks 130_1, 130_2, 130_4 to 130_7, 130_8 and 130_12 that are not actually used after mapping and for preventing the supply of the clock to the memory ranks 130_0, 130_3, 130_9 to 130_11, and 130_13 to 130_15. Also, the rank mapping circuit 250 may update the SPD 150 with information representing that only half of the memory ranks among the total memory ranks are used, that is, information representing that eight memory ranks are used, and information on the capacity of the memory ranks.

FIG. 3B illustrates a mapping table of the rank mapping circuit 250. A memory rank marked in A may be mapped to a memory rank marked in B. The A may include four bits that represent a chip selection signal CS and a chip identification CID representing a memory rank. The B may also include four bits that represent a chip selection signal CS and a chip identification CID representing a memory rank. Referring to FIG. 3B, the first memory ranks 130_0 and 130_3 are mapped to the second memory ranks 130_8 and 130_12.

Figure 4A:
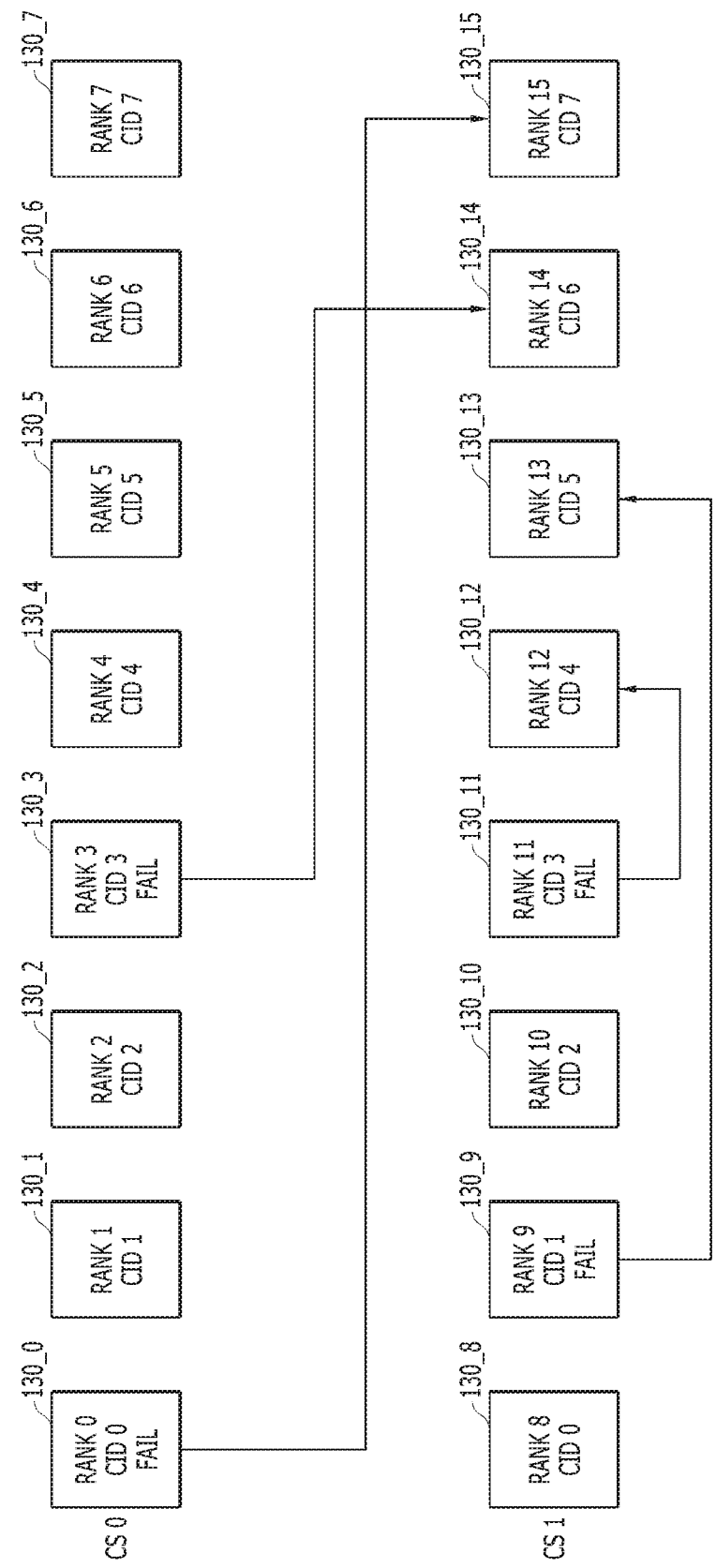
FIG. 4A illustrates (1) a linear scheme, which is a mapping scheme of the rank mapping circuit shown in FIG. 2.

FIG. 4A illustrates (1) a linear mapping scheme of the rank mapping circuit 250.

Referring to FIG. 4A, according to the linear scheme, the memory ranks 130_1, 130_2, 130_4 to 130_8, 130_10, and 130_12 to 130_15 may be used except for the defective memory ranks 130_0, 130_3, 130_9 and 130_11 among the memory ranks 130_0 to 130_15. In case of FIG. 4A, since there are defects in four memory ranks 130_0, 130_3, 130_9 and 130_11, 14 memory ranks 130_1, 130_2, 130_4 to 130_8, 130_10, and 130_12 to 130_15 may be used. Since the rank number of the used memory ranks needs to be consecutive, a mapping operation may need to be performed by the rank mapping circuit 250 in this case, too.

The rank mapping circuit 250 may map memory ranks of low numbers among the defective memory ranks 130_0, 130_3, 130_9 and 130_11 to memory ranks of high numbers among the defect-free memory ranks 130_1, 130_2, 130_4 to 130_8, 130_10, and 130_12 to 130_15. Therefore, the defective memory rank 130_0 of the lowest number may be mapped to the defect-free memory rank 130_15 of the highest number, and the defective memory rank 130_3 of the second lowest number may be mapped to the defect-free memory rank 130_14 of the second highest number, and the defective memory rank 130_9 of the third lowest number may be mapped to the defect-free memory rank 130_13 of the third highest number, and the defective memory rank 130_11 of the fourth lowest number may be mapped to the defect-free memory rank 130_12 of the fourth highest number.

The rank mapping circuit 250 may control the clock gating circuits 140_0 and 140_15 to supply the clock CLK to the actually used memory ranks 130_1, 130_2, 130_4 to 130_8, 130_10, and 130_12 to 130_15 and for preventing the supply of the clock CLK to the memory ranks 130_0, 130_3, 130_9 and 130_11 that are not used. Also, the rank mapping circuit 250 may update the SPD 150 with information representing that only 12 memory ranks are used and information on their capacity.

FIG. 4B illustrates a mapping table of the rank mapping circuit 250. A memory rank marked in A may be mapped to a memory rank marked in B. The A may include four bits that represent a chip selection signal CS and a chip identification CID representing a memory rank. The B may also include four bits that represent a chip selection signal CS and a chip identification CID representing a memory rank. Referring to FIG. 4B, it may be seen that the memory rank 130_0 is mapped to the memory rank 130_15, and the memory rank 130_3 is mapped to the memory rank 130_14, and the memory rank 130_9 is mapped to the memory rank 130_13, and the memory rank 130_11 is mapped to the memory rank 130_12.

According to the embodiments of the present invention described herein, a memory module comprising a plurality of ranks may be used even when a defective rank occurs, for example, by dividing the ranks into a plurality of first and second memory ranks and employing a rank mapping circuit for mapping a defective first memory rank among the first memory ranks to a defect-free second memory rank among the second memory ranks.

While the present invention has been described with respect to the specific embodiments, it will be apparent to those skilled in the art that various changes and modifications may be made without departing from the spirit and scope of the invention as defined in the following claims.

What is claimed is:

1. A memory module, comprising:
   a plurality of first memory ranks that share a first chip select signal and have different chip IDs;
   a plurality of second memory ranks that share a second chip select signal and have different chip IDs; and
   a rank mapping circuit suitable for mapping a defective first memory rank among the first memory ranks to a defect-free second memory rank among the second memory ranks by mapping the first chip select signal to the second chip select signal and changing a chip ID of the defective first memory rank.

2. The memory module of claim 1,
   wherein a supply of a clock toward the defective first memory rank among the first memory ranks is blocked off, and
   wherein the supply of the clock toward a defective second memory rank among the second memory ranks is blocked off.

3. The memory module of claim 2, further comprising:
   a plurality of clock gating circuits suitable for controlling the supply of the clock toward the first memory ranks and the second memory ranks.

4. The memory module of claim 1, wherein a supply of the clock toward a defective second memory rank and second memory ranks that are not used for the mapping among the second memory ranks is blocked off.

5. The memory module of claim 1, further comprising:
   a Serial Presence Detect (SPD) suitable for providing a memory controller with information representing that a total capacity of the memory module is equal to a total capacity of the first group.

6. The memory module of claim 1, wherein the rank mapping circuit is included in a module controller, and the module controller includes:
   an error correction code generation circuit suitable for generating an error correction code which is to be stored together with a write data which is to be programmed in the first group and the second group based on the write data which is to be programmed in the first group and the second group; and
   an error correction circuit suitable for correcting an error of a read data which is read from the first group and the second group based on the error correction code which is read from the first group and the second group.

7. The memory module of claim 6, wherein the module controller further includes:
   a command buffer circuit suitable for buffering a command which is to be transferred to the first group and the second group; and
   an address buffer circuit suitable for buffering an address which is to be transferred to the first group and the second group.

8. The memory module of claim 6, further comprising:
   a plurality of data buffers suitable for receiving a write data transferred from a memory controller and transferring the received write data to the module controller, and receiving a read data transferred from the module controller and transferring the received read data to the memory controller.

9. The memory module of claim 1, wherein each of the first memory ranks and the second memory ranks includes a plurality of memory devices.

10. The memory module of claim 9, wherein each of the memory devices is a Dynamic Random-Access Memory (DRAM), and
    the memory module is of a Dual In-Line Memory Module (DIMM).

* * * * *